(12) United States Patent
Ando et al.

(10) Patent No.: US 11,145,811 B2
(45) Date of Patent: Oct. 12, 2021

(54) RESISTIVE MEMORY WITH CORE AND SHELL OXIDES AND INTERFACE DIPOLES

(71) Applicant: International Business Machines Corporation, Armonk, NY (US)

(72) Inventors: Takashi Ando, Eastchester, NY (US); Jianshi Tang, Beijing (CN); Praneet Adusumilli, Somerset, NJ (US); Reinaldo Vega, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 16/655,038

(22) Filed: Oct. 16, 2019

(65) Prior Publication Data

US 2021/0119122 A1    Apr. 22, 2021

(51) Int. Cl.
*G11C 11/00* (2006.01)
*H01L 45/00* (2006.01)
*H01L 27/24* (2006.01)
*G11C 13/00* (2006.01)

(52) U.S. Cl.
CPC ........ *H01L 45/085* (2013.01); *G11C 13/0011* (2013.01); *G11C 13/0069* (2013.01); *G11C 13/0097* (2013.01); *H01L 27/2463* (2013.01); *H01L 45/1233* (2013.01); *H01L 45/1266* (2013.01); *H01L 45/146* (2013.01); *H01L 45/147* (2013.01); *H01L 45/1675* (2013.01);
(Continued)

(58) Field of Classification Search
CPC ............... H01L 45/085; H01L 45/1233; H01L 45/1675; H01L 45/1691; H01L 45/146; H01L 45/147; H01L 45/1266; H01L 27/2463; G11C 13/0011; G11C 13/0069; G11C 13/0097; G11C 2013/0078
USPC ....................................................... 365/148
See application file for complete search history.

(56) References Cited

U.S. PATENT DOCUMENTS

| 8,129,250 B2 | 3/2012 | Rossel et al. |
| 8,853,713 B2 | 10/2014 | Marsh et al. |
| 9,035,272 B2 | 5/2015 | Sheng et al. |

(Continued)

OTHER PUBLICATIONS

Hsin Wei Pan et al., "1Kbit FinFET Dielectric (FIND) RRAM in pure 16nm FinFET CMOS Logic Process," International Electron Devices Meeting (IEDM), Dec. 2015, 10.5, 4 pages.

(Continued)

*Primary Examiner* — Huan Hoang
*Assistant Examiner* — Minh Dinh
(74) *Attorney, Agent, or Firm* — Randall Bluestone; Michael J. Chang, LLC (57) ABSTRACT

Resistive memory with core and shell oxides and interface dipoles for controlled filament formation is provided. In one aspect, a ReRAM device includes at least one ReRAM cell having a substrate; a bottom electrode disposed on the substrate; spacers formed from a low group electron negativity material disposed on the bottom electrode; a core formed from a high group electron negativity material present between the spacers; and a top electrode over and in contact with the spacers and the core, wherein a combination of the low group electron negativity material for the spacers and the high group electron negativity material for the core generates an interface dipole pointing toward the core. Methods of forming and operating a ReRAM device are also provided.

20 Claims, 8 Drawing Sheets

(52) U.S. Cl.
CPC .. *H01L 45/1691* (2013.01); *G11C 2013/0078* (2013.01)

(56) References Cited

U.S. PATENT DOCUMENTS

| | | | |
|---|---|---|---|
| 9,337,425 B2 | 5/2016 | Kim et al. | |
| 9,508,439 B2 | 11/2016 | Li et al. | |
| 9,508,928 B2 | 11/2016 | Wang et al. | |
| 2013/0221307 A1* | 8/2013 | Wang | H01L 45/16 257/2 |
| 2019/0305081 A1* | 10/2019 | LaJoie | H01L 27/124 |
| 2020/0006553 A1* | 1/2020 | Li | H01L 21/823468 |
| 2020/0043820 A1* | 2/2020 | Oh | H01L 23/3128 |
| 2020/0328253 A1* | 10/2020 | Yang | H01L 29/0847 |

OTHER PUBLICATIONS

Hemanth Jagannathan et al., "Engineering High Dielectric Constant Materials for Band-Edge CMOS Applications," ECS Transactions, vol. 16, No. 5, Oct. 2008, pp. 19-26.

Kazuki Nagashima et al., "Resistive Switching Multistate Nonvolatile Memory Effects in a Single Cobalt Oxide Nanowire," Nano Letters, vol. 10, No. 4, Mar. 2010, pp. 1359-1363.

Y. Hayakawa et al., "Highly reliable TaOx ReRAM with centralized filament for 28-nm embedded application," Symposium on VLSI Technology, Jun. 2015, pp. T14-T15.

\* cited by examiner

RESISTIVE MEMORY WITH CORE AND SHELL OXIDES AND INTERFACE DIPOLES

FIELD OF THE INVENTION

The present invention relates to resistive memory devices, and more particularly, to a resistive memory with core and shell oxides and interface dipoles for controlled filament formation.

BACKGROUND OF THE INVENTION

Resistive random-access memory (ReRAM) is a type of non-volatile memory. ReRAM cells store information based on a resistance across a dielectric element. The dielectric is typically insulating. However, an applied voltage to the ReRAM cell can be used to form (electroform) an electrically-conductive path or filament through the dielectric element.

During a RESET operation, the filament is broken/ruptured thereby increasing the cell resistance. During a SET operation, an applied voltage can again be used to re-form the filament and decrease the cell resistance.

However, electroformed filaments have random placement in ReRAM cells. This random placement undesirably leads to higher forming voltage as the ReRAM cell is scaled and higher variability. ReRAM configurations have been explored using non-planar designs such as a ReRAM formed around a fin to enhance the electric field at the fin corners. However, a non-planar design introduces significant process complexity and costs.

Thus, improved techniques for controlled filament formation in planar ReRAM designs would be desirable.

SUMMARY OF THE INVENTION

The present invention provides resistive memory with core and shell oxides and interface dipoles for controlled filament formation. In one aspect of the invention, a resistive random-access memory (ReRAM) device is provided. The ReRAM device includes at least one ReRAM cell having a substrate; a bottom electrode disposed on the substrate; spacers formed from a low group electron negativity material disposed on the bottom electrode; a core formed from a high group electron negativity material present between the spacers; and a top electrode over and in contact with the spacers and the core, wherein a combination of the low group electron negativity material for the spacers and the high group electron negativity material for the core generates an interface dipole pointing toward the core.

In another aspect of the invention, a method of forming a ReRAM device is provided. The method includes depositing a bottom electrode layer on a substrate; patterning the bottom electrode layer into at least a first bottom electrode and a second bottom electrode; forming a mandrel over a portion of each of the first bottom electrode and the second bottom electrode, and over a portion of the substrate in between the first bottom electrode and the second bottom electrode; forming first spacers along vertical sidewall surfaces of the mandrel; forming cores along the vertical sidewall surfaces of the mandrel over the first spacers; forming second spacers along the vertical sidewall surfaces of the mandrel over the cores and the first spacers to form at least a first ReRAM cell over the first bottom electrode and a second ReRAM cell over the second bottom electrode; surrounding the first ReRAM cell and the second ReRAM cell in an isolation layer formed from a material selected

2 from: SiOx, SiOC, SiOCN, SiN, and combinations thereof; depositing a top electrode layer on the isolation layer and exposed top surfaces of the first ReRAM cell and the second ReRAM cell; and patterning the top electrode layer into at least a first top electrode over the first ReRAM cell and a second top electrode over the second ReRAM cell, wherein the first spacers and the second spacers each are formed from a low group electron negativity material, and the cores are formed from a high group electron negativity material, and wherein a combination of the low group electron negativity material for the spacers and the high group electron negativity material for the cores generates an interface dipole in the first ReRAM cell and the second ReRAM cell pointing toward the cores.

In yet another aspect of the invention, a method of operating a ReRAM device is provided. The method includes providing the ReRAM device having at least one ReRAM cell that includes a substrate; a bottom electrode disposed on the substrate; spacers formed from a low group electron negativity material disposed on the bottom electrode; a core formed from a high group electron negativity material present between the spacers; and a top electrode over and in contact with the spacers and the core, wherein a combination of the low group electron negativity material for the spacers and the high group electron negativity material for the core generates an interface dipole pointing toward the core; applying an electric field between the top electrode and the bottom electrode to form a filament which, based on the interface dipole, is in a center of the ReRAM cell; and applying an opposite polarity electric field between the top electrode and the bottom electrode to break the filament.

A more complete understanding of the present invention, as well as further features and advantages of the present invention, will be obtained by reference to the following detailed description and drawings.

DETAILED DESCRIPTION OF PREFERRED EMBODIMENTS

As provided above, electroformed filaments have random placement in conventional resistive random-access memory (ReRAM) cells, which undesirably leads to higher forming voltage as the ReRAM cell is scaled and higher variability. Advantageously, provided herein are ReRAM designs having core and shell oxides and interface dipoles for controlled filament formation.

Figure 1:
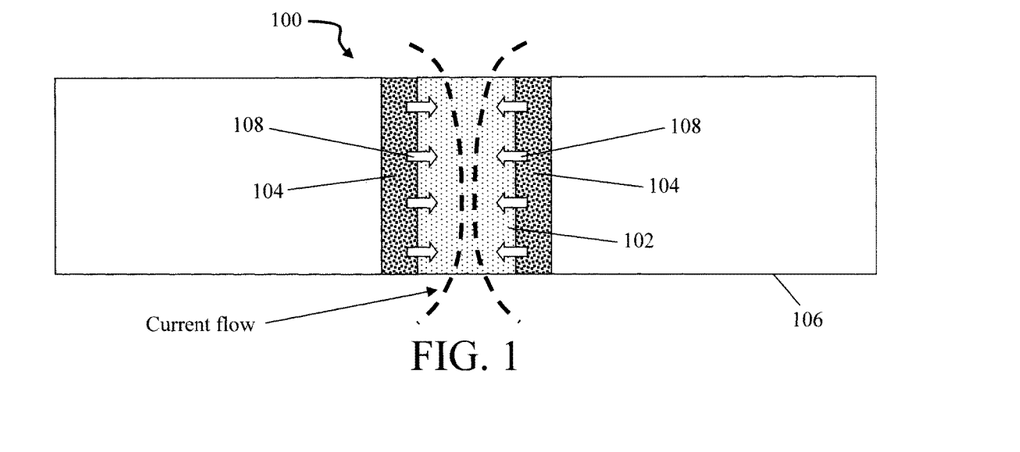
FIG. 1 is a cross-sectional diagram illustrating a resistive random-access memory (ReRAM) cell having a high group electron negativity oxide core between low group electron negativity oxide spacers in a core/shell configuration which generates an interface dipole pointing toward the oxide core according to an embodiment of the present invention.

Namely, referring to FIG. 1, a ReRAM cell 100 in accordance with the present techniques is shown. ReRAM cell 100 includes an oxide core 102 and oxide spacers 104, on either side of the core 102, embedded in an insulating layer 106.

Oxide core 102 is formed from a high group electron negativity material, and oxide spacers 104 are formed from a low group electron negativity material. Suitable high group electron negativity materials include, but are not limited to, titanium oxide ($TiO_2$) and/or aluminum oxide ($AlO_2$). Suitable low group electron negativity materials include, but are not limited to, hafnium oxide ($HfO_2$), lanthanum oxide ($LaO_2$) and/or strontium titanate ($SrTiO_3$). Suitable insulating materials include, but are not limited to, oxide materials such as silicon oxide (SiOx), silicon oxycarbide (SiOC) and/or silicon oxycarbonitride (SiOCN), and/or nitride materials such as silicon nitride (SiN).

As shown in FIG. 1, use of the high group electron negativity material for oxide core 102 in combination with the low group electron negativity material for oxide spacers 104 generates an interface dipole pointing toward the oxide core 102. See arrows 108. As a result of the interface dipole, during the electroforming process current flows are confined toward the center of the oxide core 102, facilitating filament formation in the center of ReRAM cell 100. See 'Current flow' in FIG. 1.

Figure 2:
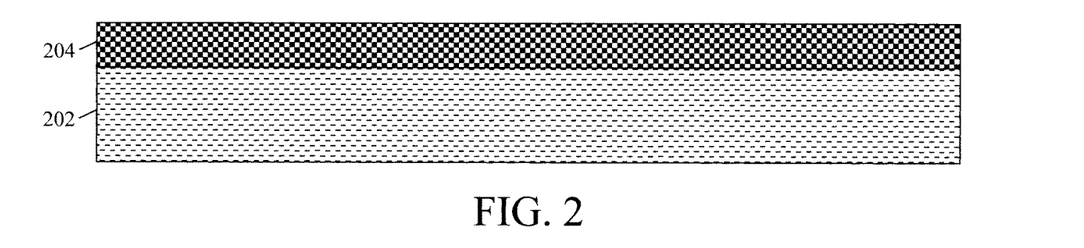
FIG. 2 is a cross-sectional diagram illustrating a bottom electrode layer having been deposited onto a substrate (e.g., a first interlayer dielectric (ILD)) according to an embodiment of the present invention.

An exemplary methodology for forming a ReRAM device in accordance with the present techniques is now described by way of reference to FIGS. 2-15. As shown in FIG. 2, the process begins with a substrate 202 on which a bottom electrode layer 204 is deposited. According to an exemplary embodiment, substrate 202 includes a (first) interlayer dielectric (ILD). Suitable ILD materials include, but are not limited to, oxide materials such as SiOx and/or organosilicate glass (SiCOH) and/or ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH).

According to an exemplary embodiment, bottom electrode layer 204 is formed from a metal or combination of metals. Suitable metals for bottom electrode layer 204 include, but are not limited to, titanium nitride (TiN), Ti-containing alloys (such as TiN and/or tungsten titanium (TiW)) and/or aluminum (Al)-containing alloys (such as titanium aluminum carbide (TiAlC)). Bottom electrode layer 204 can be deposited onto substrate 202 using a process such as evaporation or sputtering. According to an exemplary embodiment, bottom electrode layer 204 is deposited onto substrate 202 to a thickness of from about 5 nanometers (nm) to about 20 nm and ranges therebetween. Following deposition, excess metal can be removed using a process such as chemical-mechanical polishing (CMP).

Figure 3:
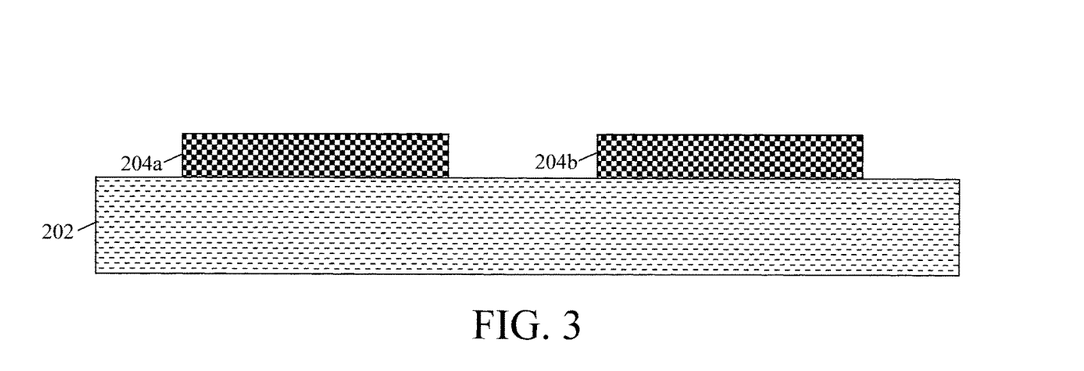
FIG. 3 is a cross-sectional diagram illustrating the bottom electrode layer having been patterned into multiple individual (first, second, etc.) bottom electrodes according to an embodiment of the present invention.
Figure 4:
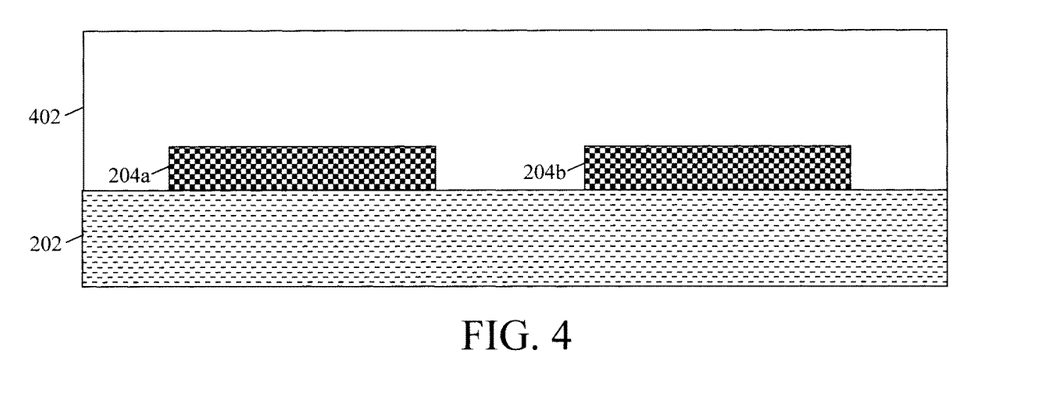
FIG. 4 is a cross-sectional diagram illustrating an insulating material having been deposited onto the substrate over the first, second, etc. bottom electrodes according to an embodiment of the present invention.

Next, as shown in FIG. 3, bottom electrode layer 204 is patterned. According to an exemplary embodiment, bottom electrode layer 204 is patterned into multiple segments, each segment forming an individual (first, second, etc.) bottom electrode 204a, 204b, etc. In this particular example, bottom electrode layer 204 is patterned into two segments, i.e., bottom electrode 204a and bottom electrode 204b. However, this is merely an example, and embodiments are contemplated herein where more than two bottom electrodes are created by the patterning of bottom electrode layer 204.

Bottom electrode layer 204 can be patterned using standard lithography and etching techniques. With standard lithography and etching processes, a lithographic stack (not shown), e.g., photoresist/organic planarizing layer (OPL)/anti-reflective coating (ARC), is used to pattern a hardmask (not shown). The pattern from the hardmask is then transferred to the underlying substrate (in this case the bottom electrode layer 204). The hardmask is then removed. A directional (anisotropic) etching process such as reactive ion etching (RIE) can be employed for patterning the bottom electrode layer 204, with substrate 202 acting as an etch stop.

An insulating material 402 is then deposited onto substrate 202 over bottom electrodes 204a, 204b, etc. See FIG. 4. As provided above, suitable insulating materials include, but are not limited to, oxide materials such as SiOx, SiOC and/or SiOCN, and/or nitride materials such as SiN. Insulating material 402 can be deposited onto substrate 202 over bottom electrodes 204a, 204b, etc. using a process such as chemical vapor deposition (CVD), atomic layer deposition (ALD) or physical vapor deposition (PVD). According to an exemplary embodiment, insulating material 402 is deposited onto substrate 202 over bottom electrodes 204a, 204b, etc. to a thickness of from about 20 nm to about 50 nm and ranges therebetween. Following deposition, insulating material 402 can be polished using a process such as CMP.

Figure 5:
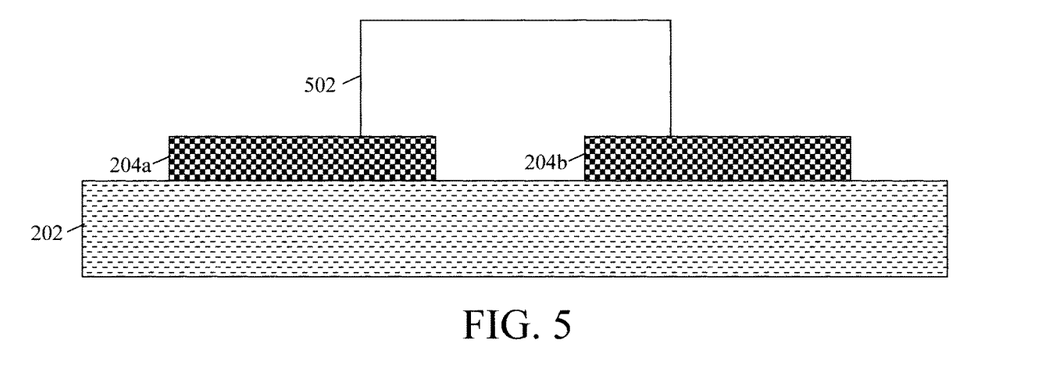
FIG. 5 is a cross-sectional diagram illustrating the insulating material having been patterned into at least one mandrel present over a portion of each of the first, second, etc. bottom electrodes, and over a portion of the substrate in between the first, second, etc. bottom electrodes according to an embodiment of the present invention.

As shown in FIG. 5, insulating material 402 is then patterned into at least one mandrel 502. According to an exemplary embodiment, mandrel 502 as patterned is present over a portion of each of the bottom electrodes 204a, 204b, etc., and over a portion of the substrate 202 in between the bottom electrodes 204a, 204b, etc. Mandrel 502 can be patterned using a patterning technique such as lithography followed by an etching process (see above). Suitable etching processes include, but are not limited to, a directional (anisotropic) etching process such as RIE. Alternatively, the mandrel 502 can be formed by other suitable techniques, including but not limited to, sidewall image transfer (SIT), self-aligned double patterning (SADP), self-aligned quadruple patterning (SAQP), and other self-aligned multiple patterning (SAMP).

As will be described in detail below, mandrel 502 will be used to place the (high group electron negativity) oxide core and (low group electron negativity) oxide spacers over the bottom electrodes 204a, 204b, etc. This will be done by successively placing each of these materials, i.e., spacer/core/spacer, along the mandrel 502 sidewall.

Figure 6:
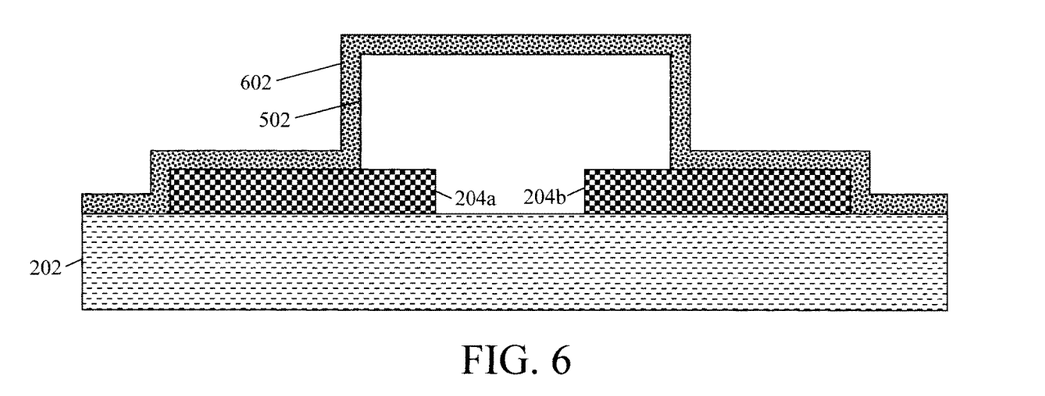
FIG. 6 is a cross-sectional diagram illustrating a (first) conformal low group electron negativity oxide layer having been deposited onto the mandrel and exposed surfaces of the first, second, etc. bottom electrodes and the substrate according to an embodiment of the present invention.

Namely, as shown in FIG. 6, a conformal (first) low group electron negativity oxide layer 602 is deposited onto the mandrel 502 and exposed surfaces of the bottom electrodes 204a, 204b, etc. and substrate 202. As provided above, suitable low group electron negativity materials include, but are not limited to, $HfO_2$, $LaO_2$ and/or $SrTiO_3$. Low group electron negativity oxide layer 602 can be deposited onto the mandrel 502 and exposed surfaces of the bottom electrodes 204a, 204b, etc. and substrate 202 using a process such as CVD, ALD or PVD. According to an exemplary embodiment, low group electron negativity oxide layer 602 is deposited onto the mandrel 502 and exposed surfaces of the bottom electrodes 204a, 204b, etc. and substrate 202 to a thickness of from about 10 nm to about 30 nm and ranges therebetween.

Figure 7:
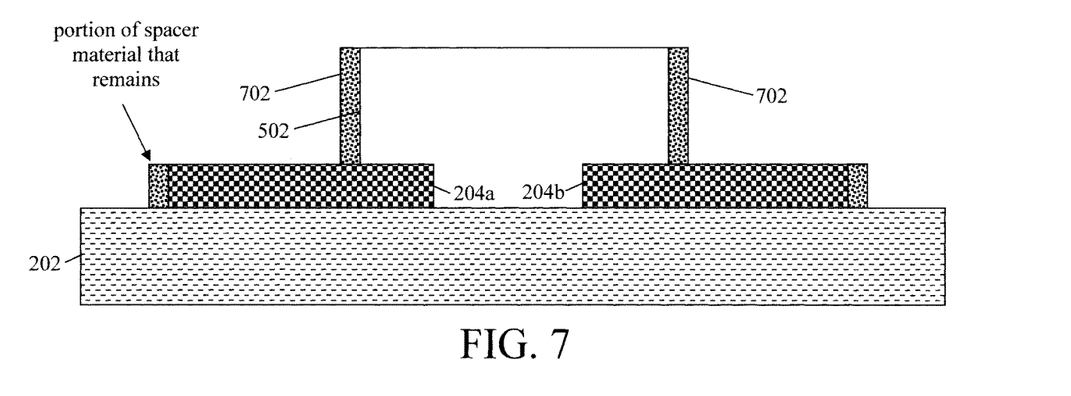
FIG. 7 is a cross-sectional diagram illustrating an etch back of the first low group electron negativity oxide layer having been performed to form first low group electron negativity oxide spacers of the present ReRAM cells along the vertical sidewalls of the mandrel, as well as on the vertical surfaces of the first, second, etc. bottom electrodes according to an embodiment of the present invention.

As shown in FIG. 7, an etch back of low group electron negativity oxide layer 602 is then performed. According to an exemplary embodiment, the etchback is performed using a directional (anisotropic) etching process such as RIE to remove low group electron negativity oxide layer 602 from the horizontal surfaces of mandrel 502, bottom electrodes 204a, 204b, etc. and substrate 202. As a result, what remains of low group electron negativity oxide layer 602 along the vertical sidewall surfaces of mandrel 502 forms the (first) low group electron negativity oxide spacers 702 of the present ReRAM cells. Notably, there are also portions of the low group electron negativity oxide layer 602 that will remain on the vertical surfaces of the bottom electrodes 204a, 204b, etc. While these portions of the low group electron negativity oxide layer 602 that remain on the vertical surfaces of the bottom electrodes 204a, 204b, etc. will not contribute to forming a ReRAM cell, they are a distinct feature of a ReRAM device that is formed by the present process.

Figure 8A:
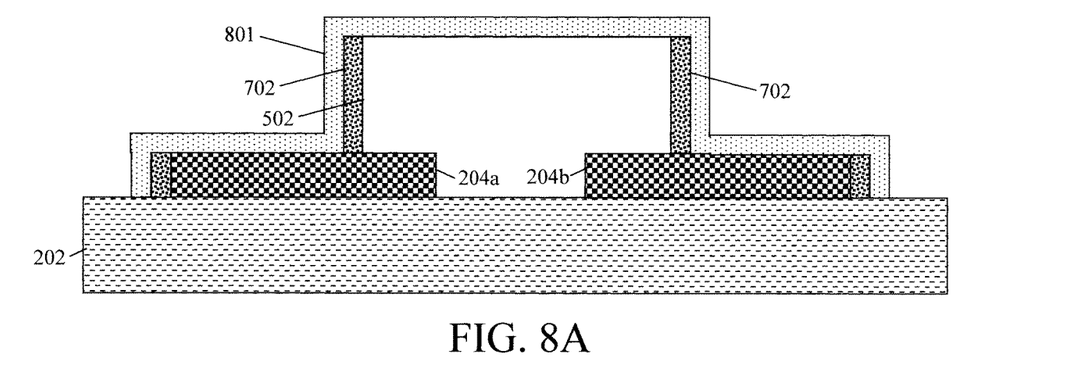
FIG. 8A is a cross-sectional diagram illustrating a conformal high group electron negativity oxide layer having been deposited onto the mandrel and exposed surfaces of the first, second, etc. bottom electrodes and the substrate over the first spacers according to an embodiment of the present invention.

The same process is then employed to form high group electron negativity oxide cores of the present ReRAM cells. Namely, as shown in FIG. 8A, a conformal high group electron negativity oxide layer 801 is deposited onto the mandrel 502 and exposed surfaces of the bottom electrodes 204a, 204b, etc. and substrate 202 over oxide spacers 702. As provided above, suitable high group electron negativity materials include, but are not limited to, $TiO_2$ and/or $AlO_2$. The high group electron negativity oxide layer can be deposited onto the mandrel 502 and exposed surfaces of the bottom electrodes 204a, 204b, etc. and substrate 202 over oxide spacers 702 using a process such as CVD, ALD or PVD. According to an exemplary embodiment, the high group electron negativity oxide layer 801 is deposited onto the mandrel 502 and exposed surfaces of the bottom electrodes 204a, 204b, etc. and substrate 202 over oxide spacers 702 to a thickness of from about 10 nm to about 30 nm and ranges therebetween.

In the same manner as described above, an etch back of the high group electron negativity oxide layer 801 is then performed. See FIG. 8B. According to an exemplary embodiment, the etchback is performed using a directional (anisotropic) etching process such as RIE to remove the high group electron negativity oxide layer 801 from the horizontal surfaces of mandrel 502, bottom electrodes 204a, 204b, etc. and substrate 202. As a result, what remains of the high group electron negativity oxide layer 801 along the vertical sidewall surfaces of mandrel 502 over oxide spacers 702 forms high group electron negativity oxide cores 802 of the present ReRAM cells. Notably, there are also portions of the high group electron negativity oxide layer 801 that will remain on the vertical surfaces of the bottom electrodes 204a, 204b, etc. While these portions of the high group electron negativity oxide layer 801 that remain on the vertical surfaces of the bottom electrodes 204a, 204b, etc. will not contribute to forming a ReRAM cell, they are a distinct feature of a ReRAM device that is formed by the present process.

Figure 8B:
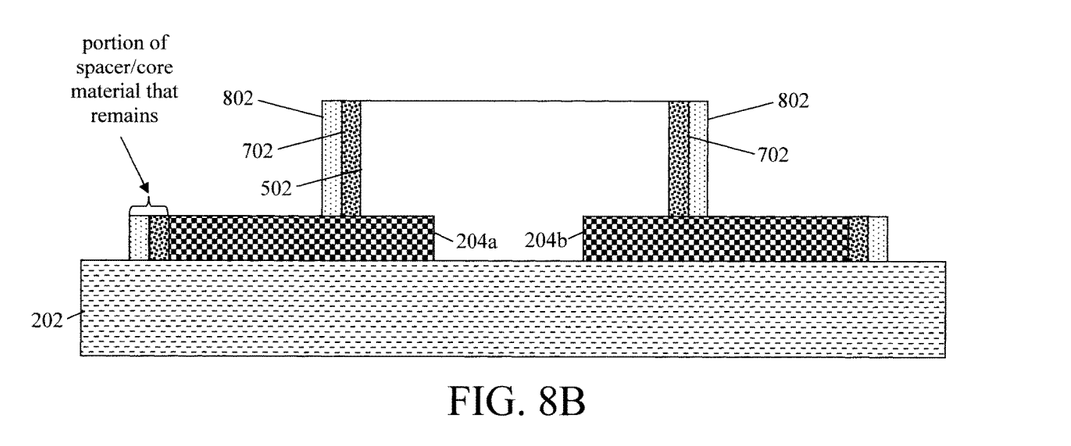
FIG. 8B is a cross-sectional diagram illustrating an etch back of the high group electron negativity oxide layer having been performed to form high group electron negativity oxide cores of the present ReRAM cells along the vertical sidewalls of the mandrel over the first spacers, as well as on the vertical surfaces of the first, second, etc. bottom electrodes according to an embodiment of the present invention.

Oxide spacers 702 are now present along the vertical surfaces of mandrel 502. Oxide cores 802 are present adjacent to the oxide spacers 702 along the vertical surfaces of mandrel 502. The same process is again employed to form low group electron negativity oxide spacers of the present ReRAM cells adjacent to oxide cores 802 opposite oxide spacers 702.

Figure 9A:
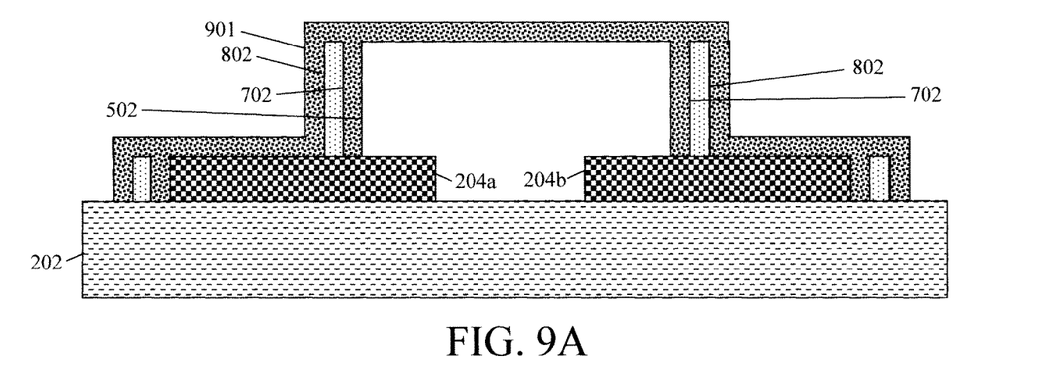
FIG. 9A is a cross-sectional diagram illustrating a (second) conformal low group electron negativity oxide layer having been deposited onto the mandrel and exposed surfaces of the first, second, etc. bottom electrodes and the substrate over the first spacers and cores according to an embodiment of the present invention.

Namely, as shown in FIG. 9A, a (second) conformal low group electron negativity oxide layer 901 is deposited onto the mandrel 502 and exposed surfaces of the bottom electrodes 204a, 204b, etc. and substrate 202 over oxide cores 802. As provided above, suitable low group electron negativity materials include, but are not limited to, $HfO_2$, $LaO_2$ and/or $SrTiO_3$. The low group electron negativity oxide layer 901 can be deposited onto the mandrel 502 and exposed surfaces of the bottom electrodes 204a, 204b, etc. and substrate 202 over oxide cores 802 using a process such as CVD, ALD or PVD. According to an exemplary embodiment, the low group electron negativity oxide layer 901 is deposited onto the mandrel 502 and exposed surfaces of the bottom electrodes 204a, 204b, etc. and substrate 202 over oxide cores 802 to a thickness of from about 10 nm to about 30 nm and ranges therebetween.

Figure 9B:
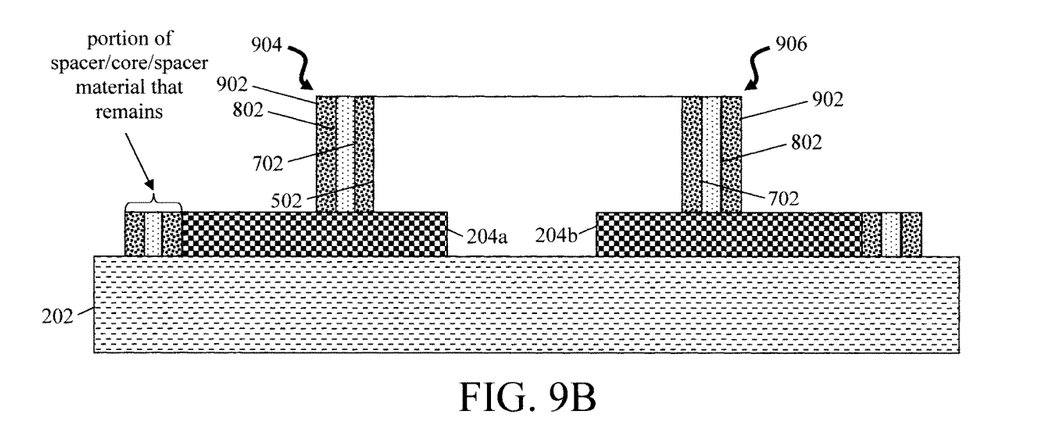
FIG. 9B is a cross-sectional diagram illustrating an etch back of the second low group electron negativity oxide layer having been performed to form (second) low group electron negativity oxide spacers of the present ReRAM cells along the vertical sidewalls of the mandrel over the first spacers and the core, as well as on the vertical surfaces of the first, second, etc. bottom electrodes according to an embodiment of the present invention.
Figure 10:
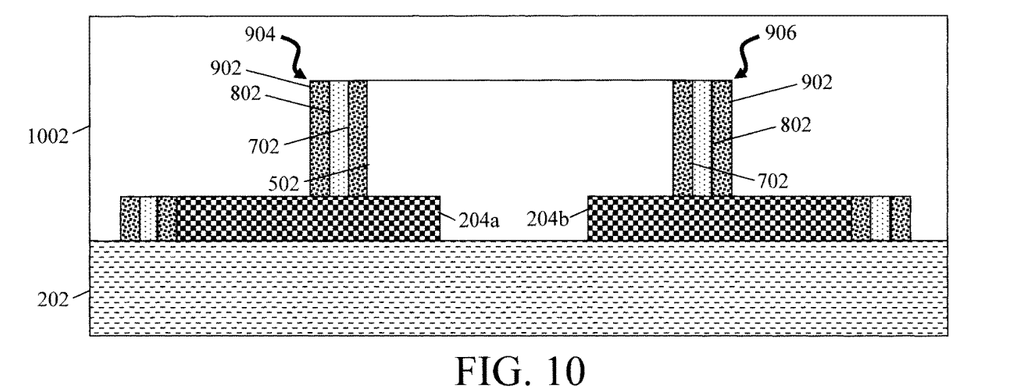
FIG. 10 is a cross-sectional diagram illustrating the substrate, the first, second, etc. bottom electrodes and the ReRAM cells having been buried in an isolation layer according to an embodiment of the present invention.
Figure 11:
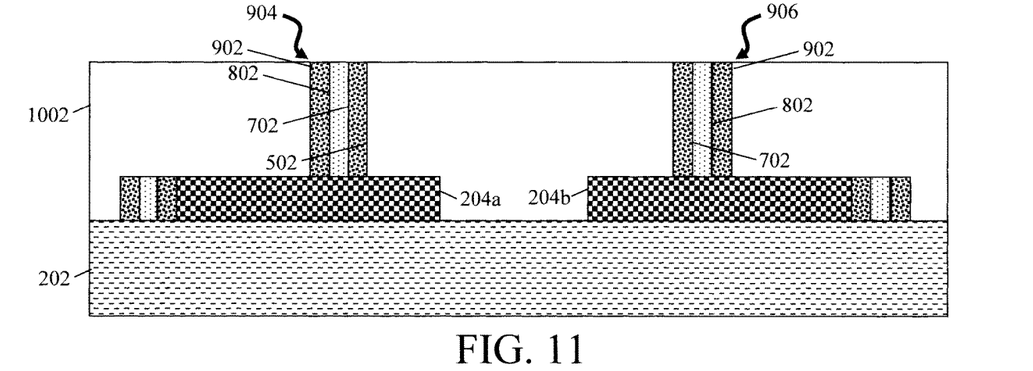
FIG. 11 is a cross-sectional diagram illustrating the isolation layer having been polished down to and exposing the tops of the ReRAM cells according to an embodiment of the present invention.

In the same manner as described above, an etch back of the low group electron negativity oxide layer 901 is then performed. According to an exemplary embodiment, the etchback is performed using a directional (anisotropic) etching process such as RIE to remove the low group electron negativity oxide layer 901 from the horizontal surfaces of mandrel 502, bottom electrodes 204a, 204b, etc. and substrate 202. As a result, what remains of the low group electron negativity oxide layer 901 along the vertical sidewall surfaces of mandrel 502 over oxide cores 802 forms (the second) low group electron negativity oxide spacers 902 of the present ReRAM cells.

As a result, first/second ReRAM cells 904 and 906 are now present along the vertical surfaces of mandrel 502 over bottom electrodes 204a and 204b, respectively. Each of the ReRAM cells 904 and 906 includes a high group electron negativity oxide core 802 in between (first and second) low group electron negativity oxide spacers 702 and 902. Thus, low group electron negativity oxide spacers 702 and 902 may be thought of as forming a shell around the high group electron negativity oxide core 802. As provided above, this core/shell configuration of high/low group electron negativity materials generates an interface dipole pointing toward the oxide core 802. As a result of this interface dipole, current flows are confined toward the center of the oxide core 802 during the electroforming process, thereby facilitating filament formation in the center of the ReRAM cells 904 and 906.

It is notable that while the exemplary fabrication process of the instant example employs multiple bottom electrodes 204a and 204b and results in the formation of multiple ReRAM cells 904 and 906 over bottom electrodes 204a and 204b, respectively, the present techniques are more generally applicable to any ReRAM cell designs including the present core/shell configuration of high/low group electron negativity materials. Thus, the illustration of a ReRAM device having multiple ReRAM cells in the instant example is merely a non-limiting example.

As noted above, there are also portions of the low group electron negativity oxide layer 901 that will remain on the vertical surfaces of the bottom electrodes 204a, 204b, etc. While these portions of the low group electron negativity oxide layer 901 that remain on the vertical surfaces of the bottom electrodes 204a, 204b, etc. will not contribute to forming a ReRAM cell, they are a distinct feature of a ReRAM device that is formed by the present process.

The substrate 202, bottom electrodes 204a and 204b and ReRAM cells 904 and 906 are then buried in an isolation layer 1002. See FIG. 10. According to an exemplary embodiment, isolation layer 1002 is formed from the same insulating material(s) as mandrel 502. As provided above, suitable insulating materials include, but are not limited to, oxide materials such as SiOx, SiOC and/or SiOCN, and/or nitride materials such as SiN. In that case, mandrel 502 can remain in place, and additional insulating material is then deposited over bottom electrodes 204a and 204b and ReRAM cells 904 and 906, and mandrel 502 to form isolation layer 1002. The additional insulating material can be deposited over bottom electrodes 204a and 204b and ReRAM cells 904 and 906, and mandrel 502 using a process such as CVD, ALD or PVD.

Following deposition, isolation layer 1002 is polished using a process such as CMP. See FIG. 11. According to an exemplary embodiment, isolation layer 1002 is polished down to the ReRAM cells 904 and 906, i.e., such that the tops of ReRAM cells 904 and 906 are exposed and coplanar with the top/polished surface of isolation layer 1002. This polishing will enable top electrodes to be formed on isolation layer 1002 in contact with the tops of ReRAM cells 904 and 906 (i.e., in contact with spacers 702/902 and core 802).

Figure 12:
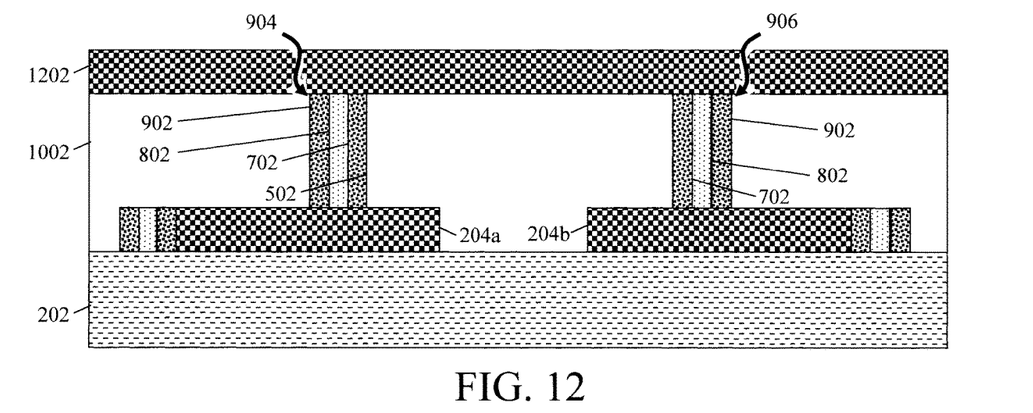
FIG. 12 is a cross-sectional diagram illustrating a top electrode layer having been deposited onto the isolation layer over the exposed tops of the ReRAM cells according to an embodiment of the present invention.

Namely, as shown in FIG. 12, a top electrode layer 1202 is deposited onto isolation layer 1002 over the exposed tops of ReRAM cells 904 and 906. According to an exemplary embodiment, top electrode layer 1202 is formed from a metal or combination of metals. Suitable metals for top electrode layer 1202 include, but are not limited to, TiN, Ti-containing alloys (such as TiN and/or TiW) and/or Al-containing alloys (such as TiAlC). Top electrode layer 1202 can be deposited onto isolation layer 1002 over the exposed tops of ReRAM cells 904 and 906 using a process such as evaporation or sputtering. According to an exemplary embodiment, top electrode layer 1202 is deposited onto isolation layer 1002 over the exposed tops of ReRAM cells 904 and 906 to a thickness of from about 5 nm to about 20 nm and ranges therebetween. Following deposition, excess metal can be removed using a process such as CMP.

The top electrode layer 1202 is then patterned. See FIG. 13. According to an exemplary embodiment, top electrode layer 1202 is patterned into multiple segments, each segment forming an individual (first, second, etc.) top electrode 1202a, 1202b, etc. In this particular example, top electrode layer 1202 is patterned into two segments, i.e., top electrode 1202a and top electrode 1202b. However, this is merely an example, and embodiments are contemplated herein where more than two top electrodes are created by the patterning of top electrode layer 1202.

Figure 13:
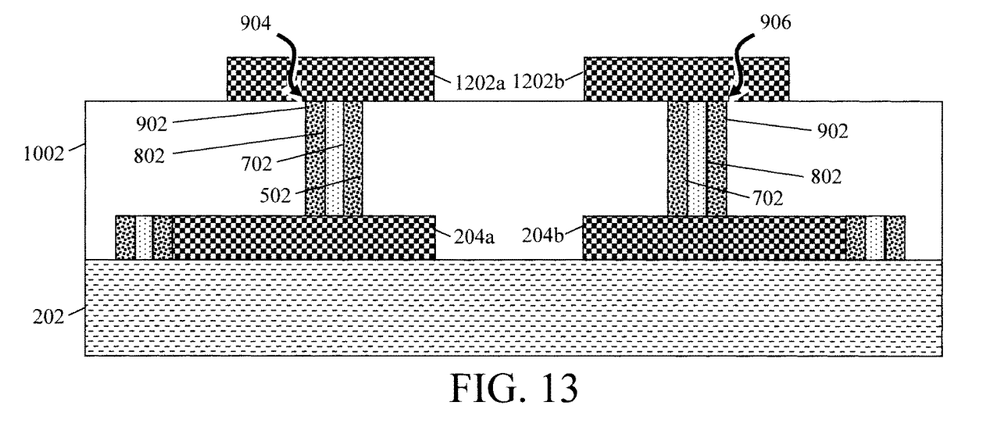
FIG. 13 is a cross-sectional diagram illustrating the top electrode layer having been patterned into multiple individual (first, second, etc.) top electrodes over and in contact with the tops of the ReRAM cells according to an embodiment of the present invention.

Top electrode layer 1202 can be patterned using standard lithography and etching techniques—see above. According to an exemplary embodiment, a directional (anisotropic) etching process such as RIE is employed for patterning the top electrode layer 1202, with isolation layer 1002 acting as an etch stop. As shown in FIG. 13, each of ReRAM cells 904 and 906 includes a high group electron negativity oxide core 802/low group electron negativity oxide spacers 702 and 902 surrounded by isolation layer 1002. ReRAM cells 904 and 906 are sandwiched between bottom electrodes 204a and 204b and top electrodes 1202a and 1202b, respectively.

Contact vias are next formed to the bottom electrodes 204a and 204b, and to the top electrodes 1202a and 1202b. To do so, a (second) ILD 1402 is deposited onto isolation layer 1002 over top electrodes 1202a, 1202b, etc. See FIG. 14. As provided above, suitable ILD materials include, but are not limited to, oxide materials such as SiOx and/or SiCOH and/or ULK-ILD materials such as pSiCOH. ILD 1402 can be deposited onto isolation layer 1002 over top electrodes 1202a, 1202b, etc. using a process such as CVD, ALD or PVD. According to an exemplary embodiment, ILD 1402 is deposited onto isolation layer 1002 over top electrodes 1202a, 1202b, etc. to a thickness of from about 15 nm to about 50 nm and ranges therebetween. Following deposition, ILD 1402 can be polished using a process such as CMP.

Figure 14:
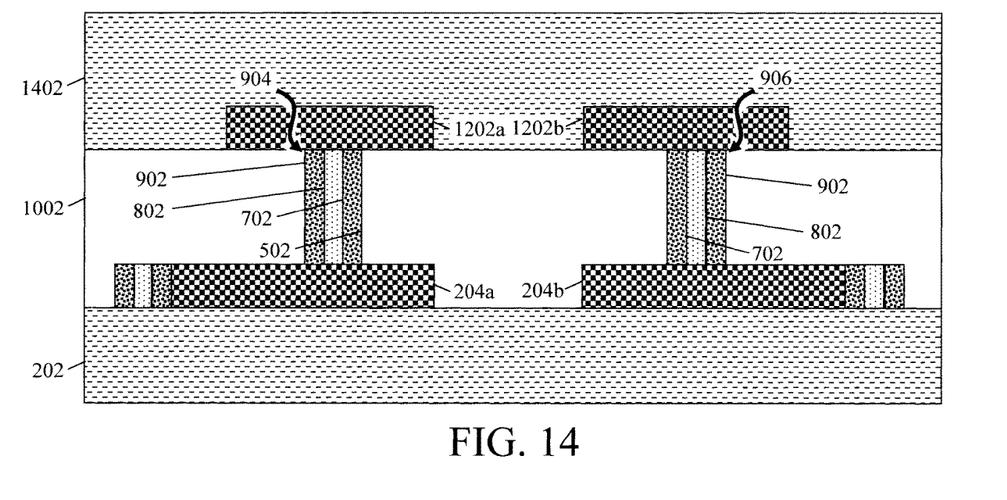
FIG. 14 is a cross-sectional diagram illustrating a (second) ILD having been deposited onto isolation layer over the first, second, etc. top electrodes according to an embodiment of the present invention.

Vias are then patterned i) in ILD 1402 over, and extending through ILD 1402 down to, top electrodes 1202a, 1202b, etc., and ii) in the ILD 1402/isolation layer 1002 over, and extending through ILD 1402/isolation layer 1002 down to bottom electrodes 204a and 204b, etc. Standard lithography and etching techniques can be employed to pattern the vias—see above. According to an exemplary embodiment, a directional (anisotropic) etching process such as RIE is employed for the via etch, with the top/bottom electrodes 1202a, 1202b, etc./electrodes 204a and 204b, etc. acting as an etch stop.

Figure 15:
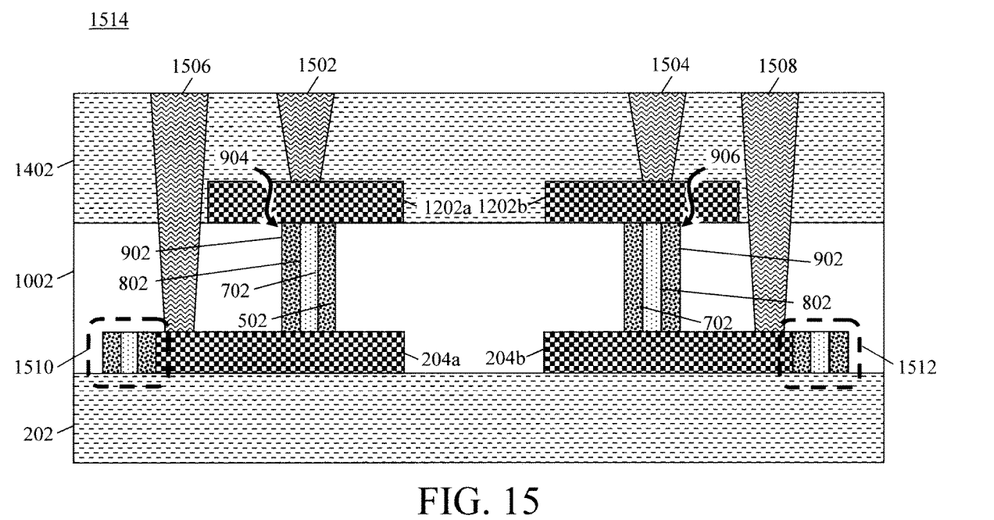
FIG. 15 is a cross-sectional diagram illustrating vias, patterned in the second ILD and/or the isolation layer extending down to the first, second, etc. top electrodes or the first, second, etc. bottom electrodes, having been filled with a contact metal(s) to form (first and second) contact vias to first, second, etc. top electrodes, and (third and fourth) contact vias to the first, second, etc. bottom electrodes according to an embodiment of the present invention.

As shown in FIG. 15, the vias are then filled with a contact metal or combination of metals to form (first and second) contact vias 1502 and 1504 to top electrode 1202a and top electrode 1202b, respectively, and (third and fourth) contact vias 1506 and 1508 to bottom electrode 204a and bottom electrode 204b, respectively. Suitable contact metals include, but are not limited to, copper (Cu), tungsten (W), nickel (Ni) and/or platinum (Pt). The contact metal(s) can be deposited into the vias using a process such as evaporation, sputtering, or electrochemical plating. Following deposition, the overburden can be removed using a process such as CMP.

Prior to depositing the contact metal(s) into the vias, a conformal barrier layer (not shown) can be deposited into and lining the vias. Use of such a barrier layer helps to prevent diffusion of the contact metal(s) into the surrounding dielectric. Suitable barrier layer materials include, but are not limited to, tantalum (Ta), tantalum nitride (TaN), titanium (Ti), and/or titanium nitride (TiN). Additionally, a seed layer (not shown) can be deposited into and lining the vias prior to contact metal deposition. A seed layer facilitates plating of the contact metal into the vias.

As highlighted above, the present fabrication techniques result in a unique structure having unused high group electron negativity oxide core/low group electron negativity oxide spacers at the vertical edges of bottom electrode 204a and bottom electrode 204b abutting substrate 202. See, e.g., areas 1510 and 1512, respectively, in FIG. 15. Further, based on the process, the unused high group electron negativity oxide core/low group electron negativity oxide spacers are only present on the outer vertical edges of bottom electrode 204a and bottom electrode 204b. As described above, while these portions of the low/high group electron negativity oxide layers that remain on the vertical surfaces of the bottom electrodes 204a, 204b, etc. will not contribute to forming a ReRAM cell, they are a distinct feature of a ReRAM device that is formed by the present process.

As shown in FIG. 15, the result of the above-described process is a ReRAM device 1514 having ReRAM cells 904 and 906 sandwiched between bottom electrodes 204a and 204b and top electrodes 1202a and 1202b, respectively. Each ReRAM cell 904 and 906 includes a high group electron negativity oxide core 802/low group electron negativity oxide spacers 702 and 902 surrounded by isolation layer 1002. Contact vias 1502 and 1504 are present to top electrode 1202a and top electrode 1202b, respectively, and contact vias 1506 and 1508 are present to bottom electrode 204a and bottom electrode 204b, respectively.

Figure 16:
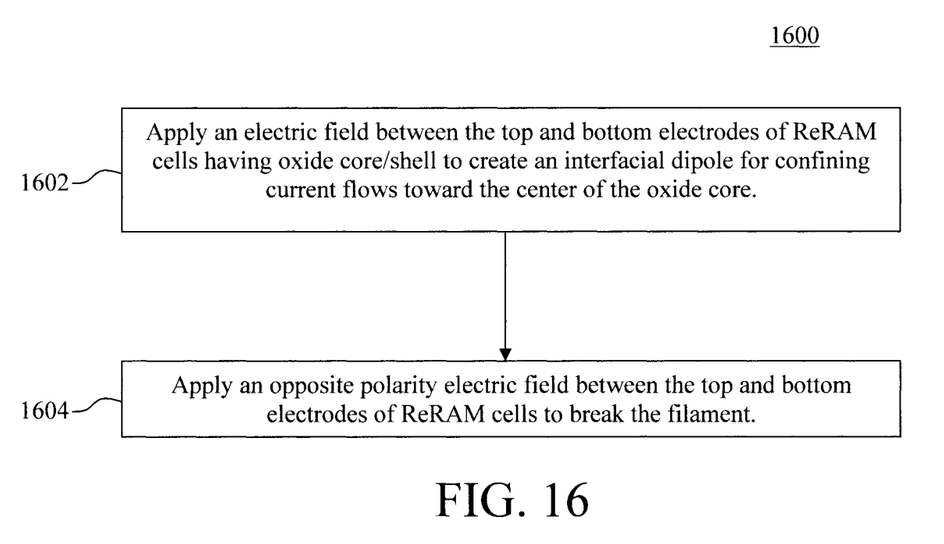
FIG. 16 is a diagram illustrating an exemplary methodology for operating the present ReRAM device according to an embodiment of the present invention.

FIG. 16 is a diagram illustrating an exemplary methodology 1600 for operating the present ReRAM device. For illustrative purposes only, methodology 1600 is described by way of reference to ReRAM device 1514. However, the steps of methodology 1600 are applicable to any of the ReRAM device designs described herein.

In step 1602, during a SET operation an electric field is applied between the top and bottom electrodes (i.e., between top electrode 1202a and bottom electrode bottom electrode 204a and/or between top electrode 1202b and bottom electrode 204b). This electric field causes ions from the electrode 204a at a lower voltage to migrate through ReRAM cells 904 and/or 906 toward the electrode at a higher voltage, forming an electrically-conductive filament in ReRAM cells 904 and/or 906, thereby decreasing the cell resistance in ReRAM cells 904 and/or 906, respectively.

As described above, use of a high group electron negativity material for the oxide core in combination with the low group electron negativity material for oxide spacers in a core/shell configuration generates an interface dipole pointing toward the oxide core. During the electroforming process, this interface dipole advantageously confines current flows toward the center of the oxide core, facilitating filament formation in the center of the ReRAM cells, i.e., at a center of the core.

In step 1604, during a RESET operation an opposite polarity electric field is applied between the top and bottom electrodes (i.e., between top electrode 1202a and bottom electrode bottom electrode 204a and/or between top electrode 1202b and bottom electrode 204b). This electric field causes the electrically-conductive filament in the high group electron negativity oxide cores 802 to break or rupture, thereby increasing the cell resistance in ReRAM cells 904 and/or 906.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A resistive random-access memory (ReRAM) device, comprising:
   at least one ReRAM cell comprising:
      a substrate;
      a bottom electrode disposed on the substrate;
      spacers comprising a low group electron negativity material disposed on the bottom electrode;
      a core comprising a high group electron negativity material present between the spacers; and
      a top electrode over and in direct contact with both the spacers and the core, wherein a combination of the low group electron negativity material for the spacers and the high group electron negativity material for the core generates an interface dipole pointing toward the core.

2. The ReRAM device of claim 1, wherein the low group electron negativity material is selected from the group consisting of: hafnium oxide ($HfO_2$), lanthanum oxide ($LaO_2$), strontium titanate ($SrTiO_3$), and combinations thereof.

3. The ReRAM device of claim 1, wherein the high group electron negativity material is selected from the group consisting of: titanium oxide ($TiO_2$), aluminum oxide ($AlO_2$), and combinations thereof.

4. The ReRAM device of claim 1, wherein the bottom electrode and the top electrode each comprises a material selected from the group consisting of: titanium nitride (TiN), Ti-containing alloys, tungsten titanium (TiW), aluminum (Al)-containing alloys, titanium aluminum carbide (TiAlC), and combinations thereof.

5. The ReRAM device of claim 1, further comprising:
an isolation layer surrounding the at least one ReRAM cell.

6. The ReRAM device of claim 5, wherein the isolation layer comprises a material selected from the group consisting of: silicon oxide (SiOx), silicon oxycarbide (SiOC), silicon oxycarbonitride (SiOCN), silicon nitride (SiN), and combinations thereof.

7. The ReRAM device of claim 1, further comprising at least one first ReRAM cell and at least one second ReRAM cell.

8. The ReRAM device of claim 7, wherein the spacers and the core of the first ReRAM cell are present between a first bottom electrode and a first top electrode, and wherein the spacers and the core of the second ReRAM cell are present between a second bottom electrode and a second top electrode.

9. The ReRAM device of claim 8, further comprising:
a first contact via to the first top electrode;
a second contact via to the second top electrode;
a third contact via to the first bottom electrode; and
a fourth contact via to the second bottom electrode.

10. The ReRAM device of claim 8, wherein the low group electron negativity material and the high group electron negativity material are disposed along outer vertical edges of the first bottom electrode and the second bottom electrode.

11. A method of forming a ReRAM device, the method comprising:
depositing a bottom electrode layer on a substrate;
patterning the bottom electrode layer into at least a first bottom electrode and a second bottom electrode;
forming a mandrel over a portion of each of the first bottom electrode and the second bottom electrode, and over a portion of the substrate in between the first bottom electrode and the second bottom electrode;
forming first spacers along vertical sidewall surfaces of the mandrel;
forming cores along the vertical sidewall surfaces of the mandrel over the first spacers;
forming second spacers along the vertical sidewall surfaces of the mandrel over the cores and the first spacers to form at least a first ReRAM cell over the first bottom electrode and a second ReRAM cell over the second bottom electrode;
surrounding the first ReRAM cell and the second ReRAM cell in an isolation layer comprising a material selected from the group consisting of: SiOx, SiOC, SiOCN, SiN, and combinations thereof;
depositing a top electrode layer on the isolation layer and exposed top surfaces of the first ReRAM cell and the second ReRAM cell; and
patterning the top electrode layer into at least a first top electrode over the first ReRAM cell and a second top electrode over the second ReRAM cell, wherein the first spacers and the second spacers each comprise a low group electron negativity material, and the cores comprise a high group electron negativity material, and wherein a combination of the low group electron negativity material for the spacers and the high group electron negativity material for the cores generates an interface dipole in the first ReRAM cell and the second ReRAM cell pointing toward the cores.

12. The method of claim 11, wherein the low group electron negativity material is selected from the group consisting of: $HfO_2$, $LaO_2$, $SrTiO_3$, and combinations thereof.

13. The method of claim 11, wherein the high group electron negativity material is selected from the group consisting of: $TiO_2$, $AlO_2$, and combinations thereof.

14. The method of claim 11, further comprising:
depositing an interlayer dielectric (ILD) onto the isolation layer over the first top electrode and the second top electrode;
forming a first contact via to the first top electrode extending through the ILD;
forming a second contact via to the second top electrode extending through the ILD;
forming a third contact via to the first bottom electrode extending through the ILD and the isolation layer; and
forming a fourth contact via to the second bottom electrode extending through the ILD and the isolation layer.

15. The method of claim 11, further comprising the steps of:
depositing a first low group electron negativity layer onto the mandrel, the first bottom electrode and the second bottom electrode;
etching back the first low group electron negativity layer to form the first spacers along the vertical sidewall surfaces of the mandrel;
depositing a high group electron negativity layer onto the mandrel, the first bottom electrode and the second bottom electrode over the first spacers;
etching back the high group electron negativity layer to form the cores along the vertical sidewall surfaces of the mandrel over the first spacers;
depositing a second low group electron negativity layer onto the mandrel, the first bottom electrode and the second bottom electrode over the first spacers and the cores; and
etching back the second low group electron negativity layer to form the second spacers along the vertical sidewall surfaces of the mandrel over the cores and the first spacers.

16. The method of claim 11, wherein the low group electron negativity material and the high group electron negativity material are present along outer vertical edges of the first bottom electrode and the second bottom electrode.

17. A method of operating a ReRAM device, the method comprising:
providing the ReRAM device having at least one ReRAM cell comprising: a substrate; a bottom electrode disposed on the substrate; spacers comprising a low group electron negativity material disposed on the bottom electrode; a core comprising a high group electron negativity material present between the spacers; and a top electrode over and in contact with the spacers and the core, wherein a combination of the low group electron negativity material for the spacers and the high group electron negativity material for the core generates an interface dipole pointing toward the core;
applying an electric field between the top electrode and the bottom electrode to form a filament which, based on the interface dipole, is in a center of the ReRAM cell; and
applying an opposite polarity electric field between the top electrode and the bottom electrode to break the filament.

18. The method of claim 17, wherein the low group electron negativity material is selected from the group consisting of: $HfO_2$, $LaO_2$, $SrTiO_3$, and combinations thereof.

19. The method of claim 17, wherein the high group electron negativity material is selected from the group consisting of: $TiO_2$, $AlO_2$, and combinations thereof.

20. The method of claim 17, wherein the at least one ReRAM cell further comprises:
   an isolation layer surrounding the at least one ReRAM cell, wherein the isolation layer comprises a material selected from the group consisting of: SiOx, SiOC, SiOCN, SiN, and combinations thereof.

* * * * *